United States Patent [19]
Niessen et al.

[11] Patent Number: 5,395,256
[45] Date of Patent: Mar. 7, 1995

[54] CONTACT ELEMENT FOR SMD PRINTED CIRCUIT BOARDS AND MOUNTING METHOD

[75] Inventors: Dieter Niessen, Erkelenz; Heiner Politze, Neuss; Michael Buschmann; Georg Pollmann, both of Willich; Mario Pussin, Mönchengladbach; Michael Pastors, Neuss, all of Germany

[73] Assignee: Esser Sicherheitstechnik GmbH, Neuss, Germany

[21] Appl. No.: 150,428

[22] Filed: Nov. 10, 1993

Related U.S. Application Data

[63] Continuation of Ser. No. 966,294, Oct. 26, 1992, abandoned.

[51] Int. Cl.6 .......................... H05K 1/00; H05K 3/34
[52] U.S. Cl. ........................................ 439/83; 29/840
[58] Field of Search .................... 29/832, 840; 439/78, 439/80, 81, 82, 83, 84

[56] References Cited

U.S. PATENT DOCUMENTS

| | | | |
|---|---|---|---|
| 3,114,080 | 12/1963 | Koda et al. | 439/83 |
| 4,332,430 | 6/1982 | Clark | 439/83 |
| 4,869,671 | 9/1989 | Pressley et al. | 439/83 |
| 4,978,307 | 12/1990 | Billman et al. | 439/83 |
| 5,144,535 | 9/1992 | Megens et al. | 439/83 |
| 5,152,056 | 10/1992 | Shook | 29/840 |

*Primary Examiner*—P. W. Echols
*Attorney, Agent, or Firm*—Henry M. Feiereisen

[57] ABSTRACT

A contact element suitable for SMD printed circuit boards is made of a flexible blank of sheet metal of approximate C-shaped cross-sectional configuration, with dimensions of a DIL package for SMD integrated circuits. The contact element is provided with bent terminals which are soldered onto respective bonding pads upon the circuit board while the top surface of the contact element is provided for contacting by a resilient external countercontact.

5 Claims, 2 Drawing Sheets

CONTACT ELEMENT FOR SMD PRINTED CIRCUIT BOARDS AND MOUNTING METHOD

This is a continuation of application Ser. No. 07/966,294, filed Oct. 26, 1992, now abandoned.

BACKGROUND OF THE INVENTION

The present invention refers to a contact element provided upon the side of the circuit path and electrically connected to at least one circuit path for use in at least partially SMD printed circuit boards, for external contacting to their SMD component side.

Current supply and/or signal transfer from or to a SMD printed circuit board may be achieved via soldered terminals or via detachable contact elements. In the latter case, one of the two coacting contact elements is resilient. It is also known to create during making of circuit paths contact surfaces which cooperate with contact springs as complementary or countercontact. Further, several types of contact pins or contact bolts designed as rotational part and possibly profiled are known which extend perpendicular to the circuit board and traverse respective bores of the circuit board for threaded or riveted connection therewith. Such contact elements permit contacting above the circuit path plane, and at sufficient length of the pins or bolts, a contacting above the component with the greatest structural height. In circuit boards which are laminated along one side, such contact elements have the drawback of including voltage-carrying or signal carrying areas along the non-laminated back side while in circuit boards with both sides being laminated these areas become unavailable for further components and/or circuit paths. In both these cases, this type of contact elements complicates handling of the circuit boards during the essentially automatic assembly process and requires a separate soldering step for electrically connecting the contact element with the pertaining circuit path.

SUMMARY OF THE INVENTION

It is an object of the present invention to provide an improved contact element obviating the afore-stated drawbacks.

In particular, it is an object of the present invention to provide an improved contact element which allows a significantly simplified mounting of components and yet permits an external contacting above the plane of the circuit path.

These objects and others which will become apparent hereinafter are attained by providing the contact element as a flexible or bendable blank of sheet metal of approximate C-shaped cross-sectional configuration, with dimensions of a dual in-line package (DIL package) for SMD integrated circuits, with the contact element including bent terminals or pins which are soldered in a pattern onto bonding pads provided on the circuit board, and having a top surface defining a contact area for an external, resiliently designed countercontact.

The provision of a contact element in accordance with the present invention has the advantage that it can be made through SMD technology, especially as a SMD integrated circuit in a DIL package, and thus can be entirely included in the automated assembly process. It is thus especially preferred to provide the contact element with standardized dimensions such as those in compliance with DIN 41870, part 16 or IEC 191-2M-1983.

In order to attain a rapid soldering to the bonding pads, the contact elements are provided with slots between the terminals which extend at least approximately to the top surface. Suitably, the top surface is bent at its opposing ends to define respective sides. In this manner, the contact element can be better handled before and during the assembly process.

BRIEF DESCRIPTION OF THE DRAWING

The above and other objects, features and advantages of the present invention will now be described in more detail with reference to the accompanying drawing in which.

DETAILED DESCRIPTION OF PREFERRED EMBODIMENTS

Figure 1:
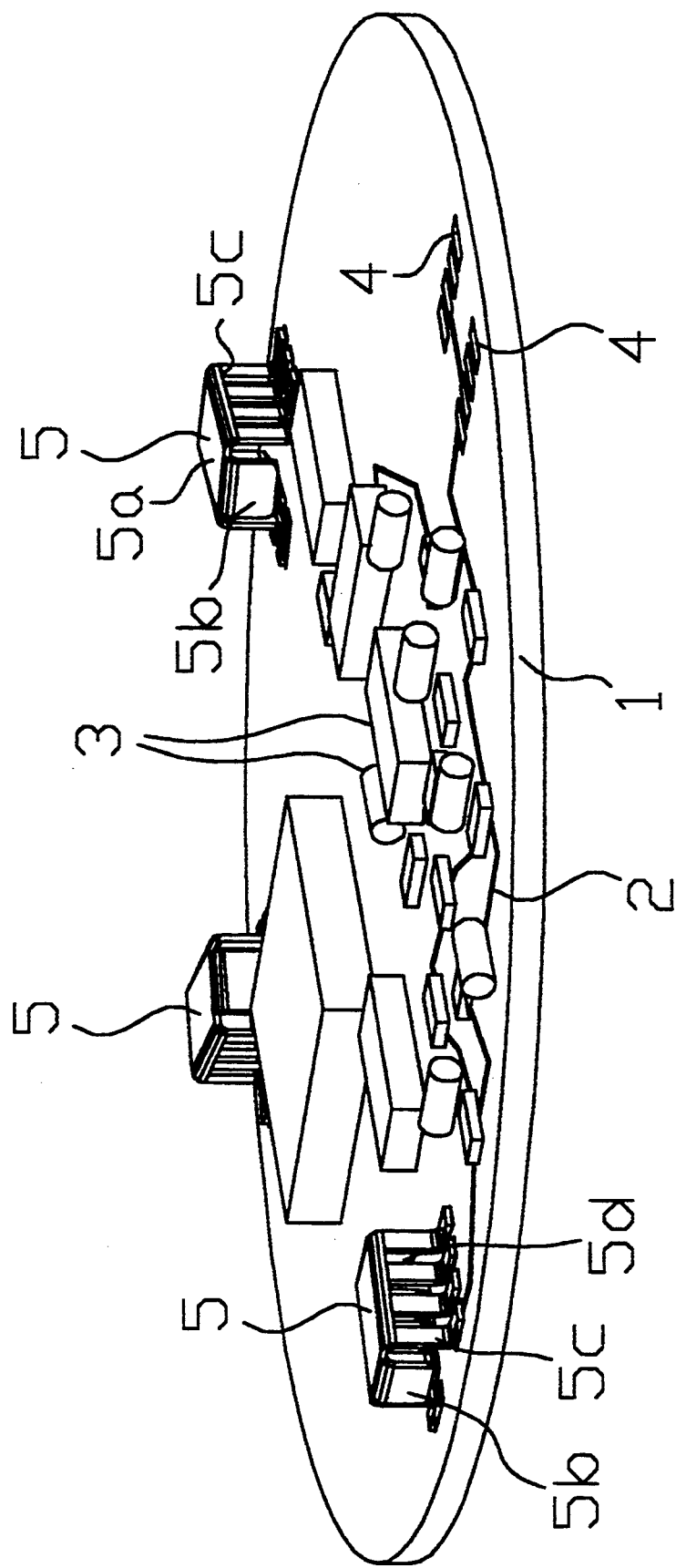
FIG. 1 is a perspective illustration of a SMD printed circuit board with four contact elements according to the invention.

Throughout all the Figures, the same or corresponding elements are always indicated by the same reference numerals.

Referring now to the drawing and in particular to FIG. 1, there is shown a perspective illustration of a circuit board 1 having an upper side provided with circuit paths 2 onto which several components or devices 3 are directly soldered and which are shown only indicative for ease of illustration. The circuit board 1 has four areas with a pattern of two by four bonding pads 4. At least one of the bonding pads 4 is connected with a circuit path 2 or forms the end of such a circuit path, with the other three bonding pads 4 being occupied by contact elements 5 which are soldered thereto.

The contact elements 5 are provided in form of a flexible or bendable blank of sheet metal, with external dimensions essentially in accordance with a SMD integrated circuit, for example in compliance with to DIN 41870, part 16 (casing family 24A) or IEC 191-2M-1983 (casing family A76).

Each contact element 5 has a top surface 5a for allowing contacting by a not shown countercontact such as a multiply slotted leaf spring. For improved handling before and during the SMD assembly process, the top surface 5a is provided at opposite ends thereof with bent sides 5b which extend downwards and end at a distance to the upper side of the circuit board 1.

In the nonlimiting example of FIG. 1, the contact elements 5 include eight terminals 5c which are provided in a conventional dual in-line package configuration (DIL package), with their bent ends bearing upon the bonding pads 4. The terminals 5c are spaced from each other to define slots 5d therebetween which extend to the top surface 5 in order to minimize heat dissipation from the bonding pads 4.

Figure 2:
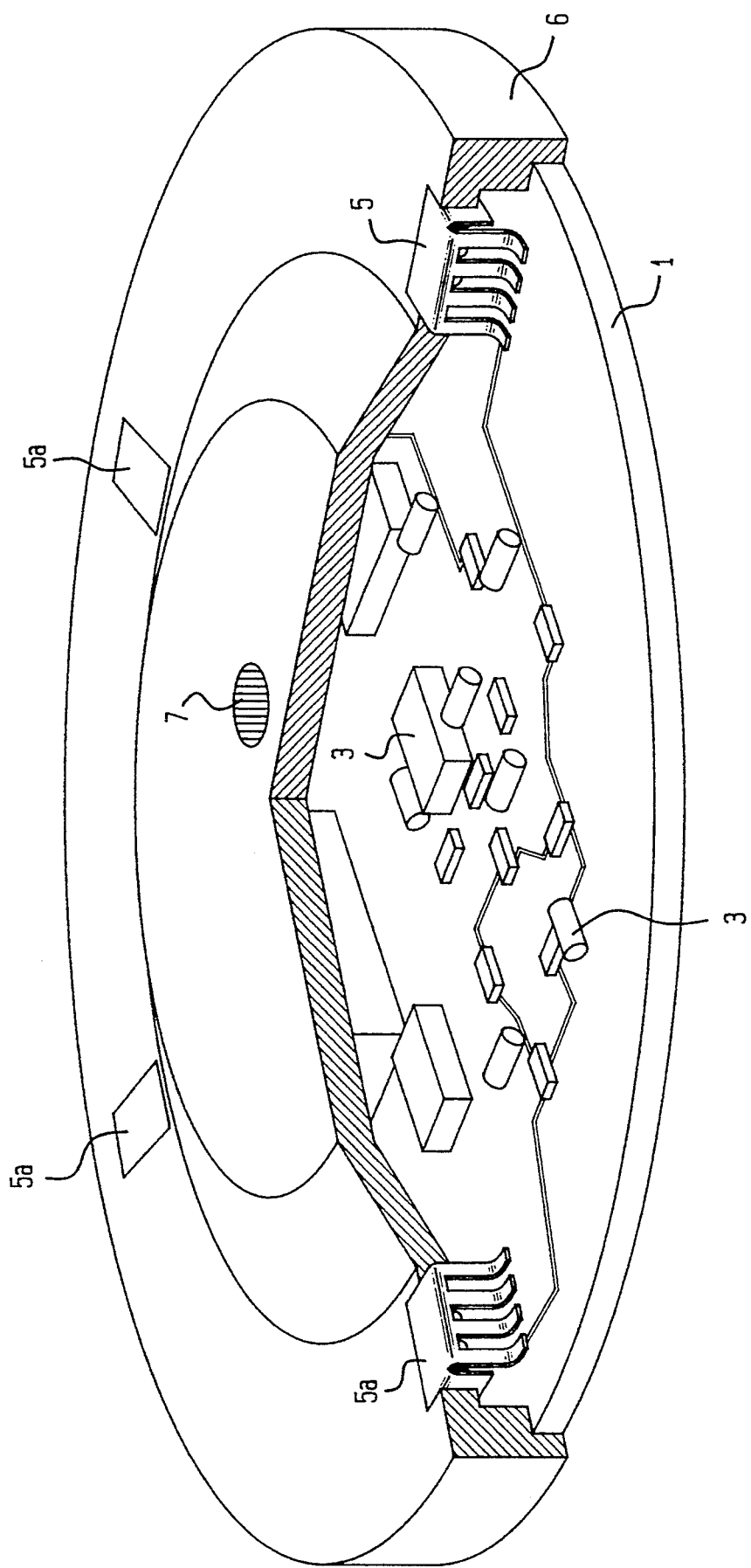
FIG. 2 is a perspective illustration according to FIG. 1, showing in detail the arrangement of a masking for the circuit board.

The finished circuit board 1 is covered by a suitable plate-shaped masking 6, as shown in FIG. 2. The masking 6 is provided with suitable openings for allowing passage of the contact elements 5 and is designed in such a manner that the contact surface 5a of the contact elements 5 approximately extends in the plane of the masking 6 i.e. flush with the upper side of the masking 6. In this manner, the masking 6 is capable of serving as guide surface for the resilient countercontacts (not shown).

As indicated in FIG. 2, the masking 6 spans over the components 3 whereby the design of the masking 6 depends on the height of the components 3 to be covered. If desired, casting material may be injected through an inlet opening 7.

While the invention has been illustrated and described as embodied in a contact element for SMD printed circuit boards, it is not intended to be limited to the details shown since various modifications and structural changes may be made without departing in any way from the spirit of the present invention.

What is claimed as new and desired to be protected by Letters Patent is set forth in the appended claims:

1. A contact element for use with a printed circuit board with surface mounted device (SMD) components, for external contacting at the SMD component side, said contact element having dimensions of a dual in-line package (DIP) for SMD integrated circuits and being provided in form of a blank of sheet metal of approximate C-shaped cross sectional configuration, with a substantially flat top surface defining the sole contact area for a mating contact and with slotted sides representing a plurality of terminals which include opposing end portions coextensive with the circuit board for sole attachment of said contact element onto bonding pads provided on the circuit board by soldering, said top surface having opposing ends which are bent to define opposing sides which extend downwards in a direction of said terminals and have a length less than the plurality of said terminals.

2. The contact element defined in claim 1 having leading dimensions in conformity with a standardized contact element.

3. The contact element defined in claim 1 wherein said sides have slots extending at least approximately to said top surface.

4. A contact element for attachment on a printed circuit board, comprising a substantially flat top surface defining the sole contact area for a mating contact and with slotted sides representing a plurality of terminals which include opposing end portions coextensive with the circuit board for sole attachment of said contact element onto bonding pads provided on the circuit board by soldering, said top surface having opposing ends which are bent to define opposing sides which extend downwards in a direction of said terminals and have a length less than the plurality of said terminals.

5. A method of mounting an electric component to a circuit board, comprising the steps of:

providing a contact element of approximate C-shaped cross sectional configuration with opposing sides and a substantially flat top surface which defines the sole contact area for a mating electric component;

providing the opposing sides with a plurality of slots to define a plurality of terminals with bent end portions arranged coextensive with the circuit board, with the top surface having opposing ends which extend downwards in a direction of the terminals and are spaced from the top surface of the circuit board; and soldering the bent end portions of the terminals onto bonding pads on the circuit board.

* * * * *